United States Patent [19]

Carlson et al.

[11] Patent Number: 4,976,539
[45] Date of Patent: Dec. 11, 1990

[54] DIODE LASER ARRAY

[75] Inventors: Nils W. Carlson, Lawrenceville; Gary A. Evans, Robbinsville; Charlie J. Kaiser, Trenton, all of N.J.

[73] Assignee: David Sarnoff Research Center, Inc., Princeton, N.J.

[21] Appl. No.: 400,108

[22] Filed: Aug. 29, 1989

[51] Int. Cl.$^5$ .......................... G01C 3/08; H01S 3/00; H01S 3/08; G02F 1/00
[52] U.S. Cl. .......................... 356/5; 330/4.3; 372/50; 372/96; 455/613
[58] Field of Search .................... 372/50, 96; 455/613; 356/5; 330/4.3

[56] References Cited

U.S. PATENT DOCUMENTS

| | | | |
|---|---|---|---|
| 3,488,586 | 1/1970 | Watrous et al. | 455/613 |
| 4,162,460 | 7/1979 | Gouda | 330/4.3 |
| 4,552,456 | 11/1985 | Endo | 356/5 |
| 4,744,088 | 5/1988 | Heinen et al. | 372/50 |
| 4,747,107 | 5/1988 | Miller | 372/50 |
| 4,872,176 | 10/1989 | Hammer | 372/50 |

OTHER PUBLICATIONS

K. Kojima et al., Applied Physics Letters, vol. 52, No. 12, Mar. 21, 1988, pp. 942–944.
J. K. Carney et al., Applied Physics Letters, vol. 38, No. 5, Mar. 1, 1981, pp. 303–305.
Harder et al., Applied Physics Letters, vol. 39, No. 5, Sep. 1, 1981, pp. 382–383.
H. Kawaguchi, IEEE Proceedings, vol. 129, Part 1, No. 4, Aug. 1982, pp. 141–147.
Y. Arakawa et al., IEEE Journal of Quantum Electronics, vol. QE-22, No. 9, Sep. 1986, pp. 1887–1899.

Primary Examiner—Stephen C. Buczinski
Attorney, Agent, or Firm—W. J. Burke

[57] ABSTRACT

A diode laser array comprises a substrate of a semiconductor material having first and second opposed surfaces. On the first surface is a plurality of spaced gain sections and a separate distributed Bragg reflector passive waveguide at each end of each gain section and optically connecting the gain sections. Each gain section includes a cavity therein wherein charge carriers are generated and recombine to generate light which is confined in the cavity. Also, the cavity, which is preferably a quantum well cavity, provides both a high differential gain and potentially large depth of loss modulation. Each waveguide has a wavelength which is preferably formed by an extension of the cavity of the gain sections and a grating. The grating has a period which provides a selective feedback of light into the gain sections to supporting lasing, which allows some of the light to be emitted from the waveguide normal to the surface of the substrate and which allows optical coupling of the gain sections. Also, the grating period provides an operating wavelength which is on the short wavelength side of the gain period of the gain sections required for laser oscillation. An RF pulse is applied so as to maximize the magnitude of the loss modulation and the differential gain in the gain sections. The array is operated by applying a DC bias to all the gain sections at a level just below the threshold of the gain sections to only one of the gain sections which raises the bias in all of the gain sections to a level that causes all of the gain sections to oscillate. Thus, a small bias can turn the array on and off.

20 Claims, 4 Drawing Sheets

CURRENT TO MIDDLE GAIN SECTION

DIODE LASER ARRAY

The invention described herein was made in the performance of work under NASA Contract No. NAS1-18525 and is subject to the provisions of Section 305 of the National Aeronautics and Space Act of 1958 (72 Stat, 435; 42 U.S.C. 2457).

FIELD OF THE INVENTION

The present invention relates to a semiconductor diode laser array, and, more particularly, to an injection coupled surface emitting semiconductor diode laser array which can operate as an electro-optic amplifier, and has high speed switching characteristics.

BACKGROUND OF THE INVENTION

In free space optical communication systems, diode lasers are attractive as a source of light because of their small size and relatively high efficiency. A diode laser, in general, is a body of a semiconductor material which when biased emits light through the recombination of oppositely charged carriers. The body generally includes regions of opposite conductivity type, which when properly biased, inject charge carriers of one conductivity type from one of the regions into the other where the light generating recombination occurs. Diode lasers in general include a cavity which confines both the charge carriers and the generated light. Also, at the ends of the cavity the light is reflected in a manner so as to generate a beam of substantially coherent light which is generally emitted from an edge of the diode.

Since most single-emitter diode lasers have large angular beam divergences, generally greater than 10°, large collimation telescopes are necessary to form the appropriate communications beam, which is typically about 20 cm. in diameter. This large beam diameter is required for free space optical links because typical propagation distances are on the order of 10,000 km. and the diameter of the 35 receiving telescope is about 10 cm. in diameter. These constraints dictate that the optical transmitter for such a link must have a power output of 500 mW or more in a narrow divergence diffraction limited single lobed far field. Stable single spectral and spatial mode operation are also required, and this stability must be maintained at multi-GHz modulation rates. Single element diode lasers operating in a single mode are limited to operating powers of about 100 mW. Therefore, suitable coherent diode laser arrays which contain a plurality of the diode lasers are necessary to provide the desired power and radiant intensity of the beam which is needed for free space optical communication systems.

A type of diode laser array which has been recently developed is a coherent monolithic array of injection-coupled grating surface emitting (GSE) diode lasers. An array of GSE diode lasers, in general, comprises on a single substrate of a semiconductor material a plurality of electrically isolated gain sections that are within a network of distributed Bragg reflector (DBR) passive waveguides. The gain sections contain regions of opposite conductivity type and a cavity in which the charge carriers of opposite conductivity type are formed and recombine to generate light. The DBR sections function in a three-fold manner. The second grating order of the DBR provides wavelength selection and feedback necessary to support laser oscillation. In first order, the grating couples light out normal to the substrate surface. Finally, the transmissivity of the DBR sections are sufficiently large so as to couple adjacent gain sections. It has been found that GSE arrays can have output powers in excess of 1 W, far field beam divergence of 1° by 0.01° and spectral outputs narrower than 0.25 Angstroms. One such DBR array is shown and described in the article of G.A. Evans et al entitled "Coherent, monolithic two-dimensional (10×10) laser arrays using grating surface emission", published in APPLIED PHYSICS LETTERS, Vol 53(22) Nov. 28, 1988, pgs. 2123-2125. However, for optical communication purposes, it is necessary to be able to switch this type of array at relatively high speeds. Therefore, it is desirable to have GSE array which not only can provide high power output, but which can be switched relatively fast for communication purposes.

SUMMARY OF THE INVENTION

A diode laser array comprises a substrate of a semiconductor material having a major surface. A plurality of gain sections are in said major surface. Each of the gain sections as a cavity therein for generating light and which can provide both a high differential gain and electrically large depth of loss modulation. A distributed Bragg reflector waveguide is at each end of each gain section and optically connects the gain sections. Each Bragg reflective waveguide has a period to provide an operating wavelength which is on the short wavelength side of the gain peak of the gain sections. Means is provided to apply a DC bias to each of the gain sections and means is provided to apply modulation pulse to one of the gain sections to switch the array to its light emitting condition.

DETAILED DESCRIPTION OF PREFERRED EMBODIMENT

Figure 1:
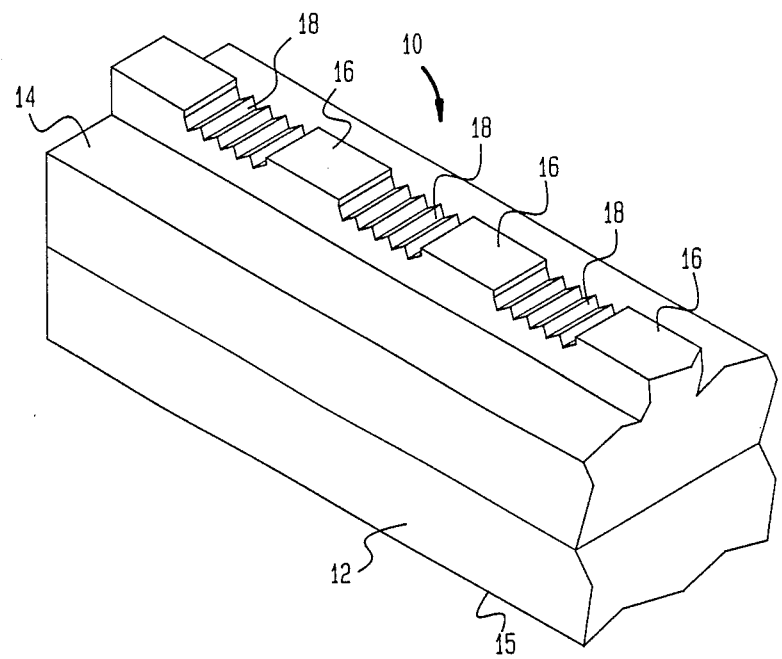
FIG. 1 is a top view of one form of a diode laser array of the present invention.

Referring initially to FIG. 1, there is shown one form of the diode laser array 10 of the present invention. The array 10 comprises a substrate 12 having first and second opposed surfaces 14 and 15. On the first surface 14 are a plurality of spaced gain sections 16 arranged in a line. At each end of each gain section 16 is a distributed Bragg reflector (DBR) waveguide 18. A separate DBR waveguide extends between each pair of adjacent gain sections 16 so as to optically connect them. Although in FIG. 1, the array 10 is shown as having three gain sections 16 and three DBR waveguides 18, it can have any number of the gain sections 16 so long as there are at least two gain sections 16 with a DBR waveguide at each end of each gain section 16. Also, the gain sections 16 may be arranged in a plurality of lines as long as there is provided means for optically connecting the lines of gain sections together.

Figure 2:
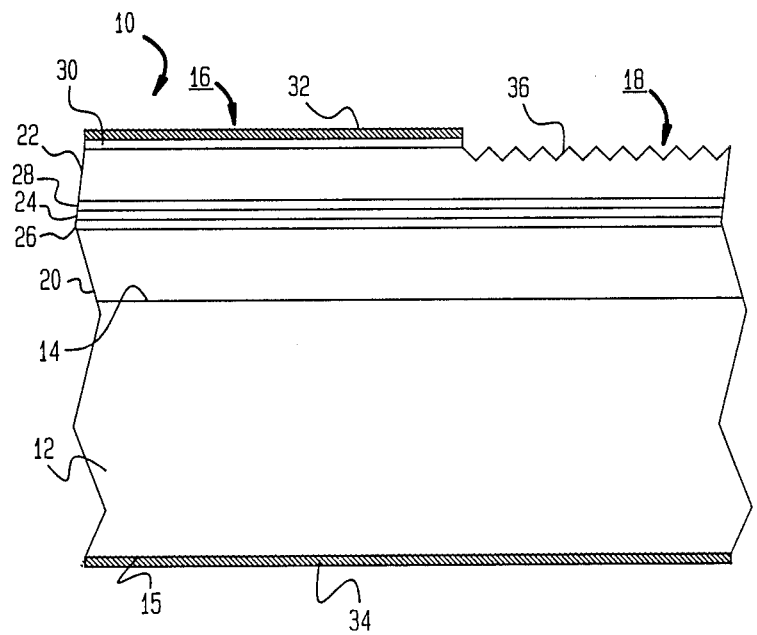
FIG. 2 is a sectional view taken along line 2—2 of FIG. 1.

As shown in FIG. 2, each gain section 16 is in the form of a diode laser. As shown, each diode laser gain section 16 comprises a pair of clad layers 20 and 22 of a semiconductor material with the clad layers 20 and 22 being of opposite conductivity types. Thus, if the clad layer 20 is of P-type conductivity, the clad layer 22 is of N-type conductivity. Between the two clad layers 20 and 22 is a thin quantum well layer 24 of a semiconductor material which is undoped. A description of quantum well lasers can be found in the article of Y. Arakawa entitled "Quantum Well Lasers-Gain, Spectra, Dynamics", published in IEEE JOURNAL OF QUANTUM ELECTRONICS, Vol. QE-22, No. 9, September 1986, pgs. 1887–1986; . The clad layers 20 and 22 are of a material having an energy band-gap higher than that of the material of the quantum well layer 24 so as to achieve both charge carrier and light confinement within the quantum well layer 4. For example, the clad layers 20 and 22 may be of aluminum gallium arsenide wherein the mole fraction of aluminum arsenide is about 70% ($Al_{.7}Ga_{.3}$), and the quantum well layer 24 may be of gallium arsenide. Between the quantum well layer 24 and each of the clad layers 20 and 22 is a confinement layer 26 and 28 respectively, each of which is of the same conductivity type as its adjacent clad layer. The confinement layers 26 and 28 are of aluminum gallium arsenide and may be graded so that the mole fraction of aluminum arsenide is varies from that of the clad layers 20 and 22 at the clad layers to about one-half of that in the clad layers 20 and 22 at the quantum well layer 24. Thus, the composition of graded confinement layers 26 and 28 would vary from $Al_{.7}Ga_{.3}$ at the clad layers 20 and 22 to $Al_{.7}Ga_{.3}$ at the quantum well layer 24. However, the confinement layers 26 and 28 may be of uniform composition having an energy band-gap between that of the materials of the clad layers 20 and 22 and the quantum well layer 24, such as $Al_{.7}Ga_{.3}$.

A capping layer 30 is over the outermost clad layer 22. The capping layer 30 is of a semiconductor material of the same conductivity type as that of the clad layer 22, i.e. P-type conductivity. The capping layer is preferably of gallium arsenide. The substrate 12 is of a conductivity type the same as that of the clad layer 20, i.e. N-type conductivity. The substrate 12 can be of any semiconductor material on which the gain regions 16 and DBR waveguide regions 18 can be formed, such as gallium arsenide. Typically the clad layers 20 and 22 are of a thickness of about 1.2 micrometers, the quantum well layer is of a thickness of about 50 to 100 Angstroms, the confinement layers 26 and 28 are of a thickness of about 0.2 to 0.4 micrometers, and the capping 30 layer is of a thickness of about 0.2 micrometers. A contact layer 32 of a conductive material is on and makes ohmic contact with the capping layer 30. A contact layer 34 of a conductive material is on and makes ohmic contact with the second surface 15 of the substrate 12.

Each of the DRB waveguides 18 comprises extensions of the clad layers 20 and 22, the quantum well layer 24 and the graded layers 26 and 28 of the gain sections 16. To improve performance, the thickness of the quantum well layer in the waveguide 18 may be different than that of the gain section 16 or the quantum well layer in the waveguide could be partially disoriented. However, the DBR waveguides 18 do not include the capping layer 30 or the contact layer 32. Instead, in the surface of the outermost clad layer 22 is a grating. As shown the grating is formed by a plurality of parallel V-shaped grooves 36 extending transversely across the clad layer 22. The number and dimensions of the grooves 36 are such as to form a second order grating. For example, the grooves 36 may have a period of about 2500 angstroms. However, the waveguide 18 may have any other type of grating formed therein. Also, the clad layer 22 in the DBR 18 is thinner than in the gain section 20, being about 0.1 micrometers in thickness. Each of the DBR waveguides 18 and gain sections 16 are typically several hundred micrometers in length. In the waveguides, the quantum well layer 24 serves as a waveguide and the clad layers 20 and 22 and the confinement layers 26 and 28 serve to confine the light in the quantum well waveguide layer 24.

Figure 4:
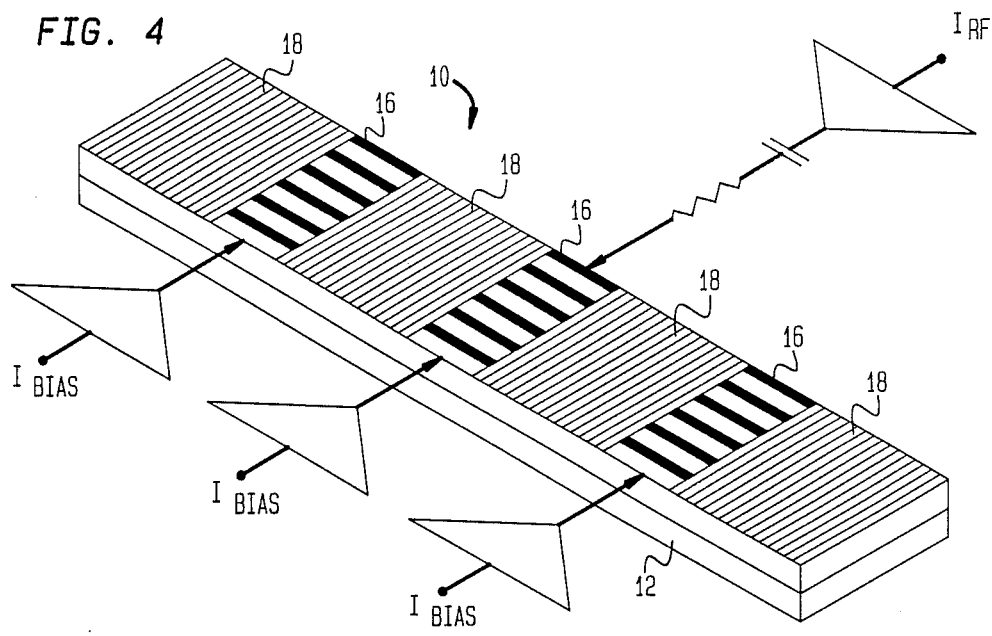
FIG. 4 is a schematic showing of the array illustrating the manner of operating the array.
Figure 5:
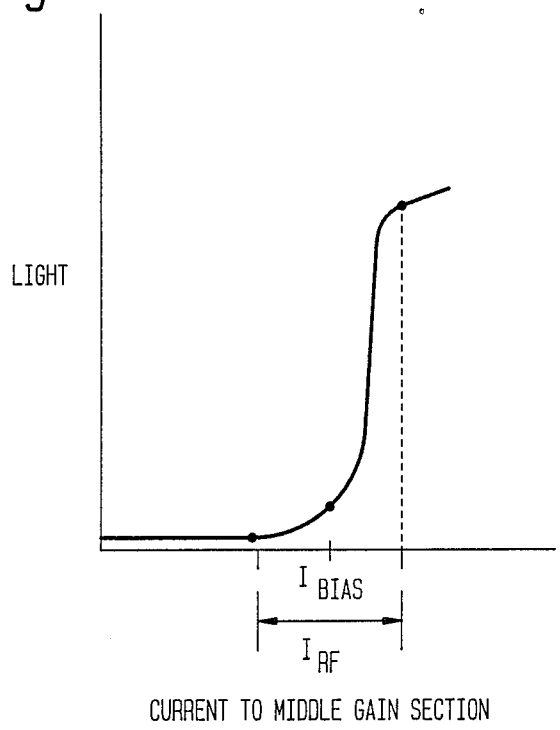
FIG. 5 is a graph showing the manner that the array operates upon being biased.

As shown in FIG. 4, the diode laser array 10 is operated by applying a DC bias ($I_{Bias}$) to each of the gain sections 16. As indicated in FIG. 5, this bias is less than that necessary to cause the gain sections 16 to oscillate and thereby generate light. A modulation pulse, such as an RF bias ($I_{RF}$), is then applied to one of the gain sections 16. As shown in FIG. 5, this additional bias is sufficient to drive the one gain section 16 such that saturation of loss occurs. This lowers the round trip loss in the entire array so as to turn on all of the gain sections 16 and thereby cause the gain sections 16 to oscillate in a mutually coherent fashion. By having the DC bias applied to the gain sections 16 very close to their threshold voltage, only a small RF bias is necessary to one of the gain sections 16 to turn on all of the gain sections 16. It has been found that the DC bias can be applied to the gain sections 16 such that the optical power output from all of the gain sections 16 is greater than the small RF bias needed to turn them on. Thus, the device 10 acts as an electro-optical amplifier.

Since the diode laser array 10 can be operated by a small pulse, only a small power source is required for the operation of the array 10. By using gain sections 16 which have a high differential gain, the array 10 can be quickly turned on and off.

In order for the array 10 to achieve both high speed switching and short output pulses, it is necessary that the gain sections 16 have suitably strong saturable optical loss as well as a carrier dependent optical loss at certain wavelengths. Quantum well active layers provide both of these conditions. Although the gain sections 16 of the array 10 have been shown as being single quantum wells, they can alternatively be multiple quantum wells. Also, although the array has been described as being operated by a RF pulse, any modulation of the one section which increases the bias thereon, such as a DC pulse, can be used.

The DBR waveguide 18 serves three functions. The second grating order provides wavelength selective feedback of the light generated in the gain sections 16 which is necessary to support laser oscillation in the gain sections 16. Secondly, the first grating order couples light out of the amplifier 10 normal to the surface 14 of the substrate 12 so as to achieve emission of light from all of the DBR waveguides 18. Thirdly, the transmissivity of the DBR waveguide 18 must be sufficiently high so that light passes through the waveguide 18 from one gain region 16 to the next so that adjacent gain sections 16 are optically coupled. In addition, the grating period of the DBR waveguides 18 should be such that the operating wavelength of the device is on the short wavelength side of the gain peak of the gain sections 16 so that the magnitude of the loss modulation and the differential gain of the gain sections 16 is maximized.

Figure 3:
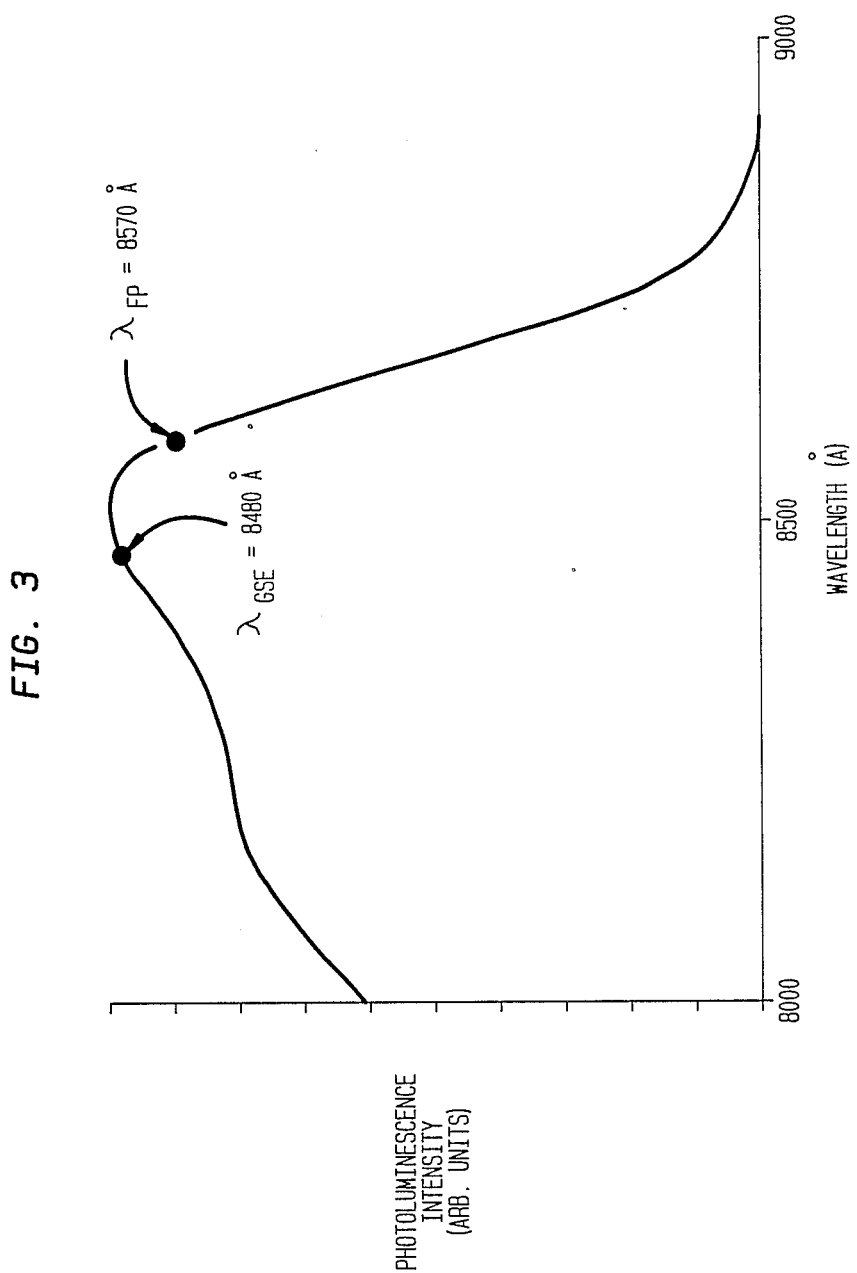
FIG. 3 is a curve showing the photoluminescence spectrum of a single quantum well active/waveguide layer of an array of the present invention.

The nominal operating wavelength of a grating-surface-emitting laser array is determined by satisfying the Bragg condition for the grating in the DBR waveguides 18. The Bragg wavelength is equal to the grating period times the effective index of the spatial mode in the DBR waveguide 18. Wavelengths within the reflectivity bandwidth of the DBR waveguide will be retro-reflected back into the gain sections so that laser oscillation of the array only occurs inside this small bandwidth centered on the Bragg wavelength of the waveguide region. Therefore, with a knowledge of the gain spectrum and waveguide effective index, it is possible to select a specific operating wavelength by appropriate choice of the grating period. An example of how the operating wavelength of an array can be set to the short wavelength side of the peak of the gain spectrum is shown in FIG. 3. Here the photoluminescence spectrum of a single quantum well structure of the type shown in FIG. 2 of an array 10 is shown. The peak of the quantum well photoluminescence spectrum (which is about 8510 Angstroms for the spectrum shown in FIG. 3) corresponds closely to the peak of the gain spectrum. However, a grating period of 2584 Angstroms results in an operating wavelength of 8480 Angstroms, which is about 30 Angstroms to the short wavelength side of the peak of the photoluminescence.

Figure 6:
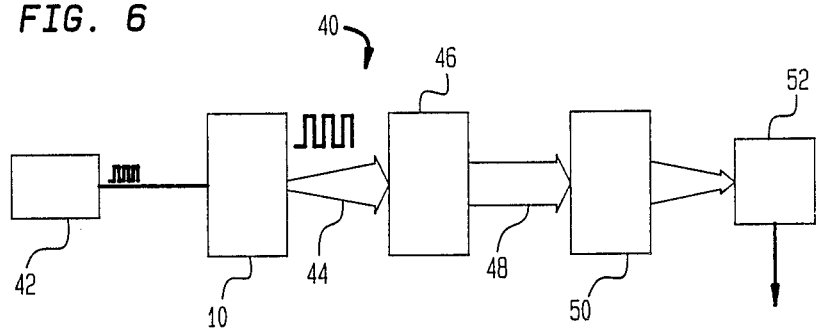
FIG. 6 is a schematic diagram of a typical free space optical communication system using the laser array of the present invention.

Referring to FIG. 6 there is shown a schematic diagram of a typical free air optical communication system 40 which utilizes the diode laser array 10 of the present invention. The laser array 10 is fed from a power source 42 capable of providing a series of modulated pulses, such as RF pulses. The array 10 emits pulses of light 44 of a power greater than the amplitude of the input pulses from the power source 42. The pulsed light beam 44 is directed into a transmitting telescope 46 which collimates the light and directs it as a beam 48 in a desired direction. The beam 48 is picked up by a receiving telescope 50 which directs it into an optical detector 52. The optical detector 52 coverts the pulsed beam of light into electrical pulses which are fed to a receiving circuit, not shown. By varying the amplitude of, the spacing between and/or length of the electrical pulses fed to the array 10, information can be communicated through the system 40.

Figure 7:
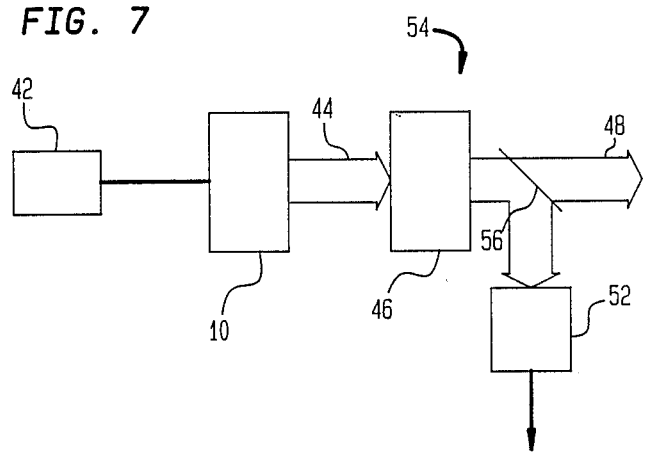
FIG. 7 is a schematic diagram of a typical optical radar system using the laser array of the present invention.

Referring to FIG. 7, there is schematically shown an optical radar system 54 which utilizes the diode laser array 10 of the present invention. In the radar system 54, like in the communication system 40, the laser array 10 is fed by a power source 42 which provides modulation pulses to the array 10. The pulses of light 44 from the array 10 are feed into a transmitting telescope 46 which directs a beam of pulsed light 48 through a beam splitter 56 to an object to be detected, not shown. The beam splitter 56 also directs some of the emitted beam 48 to an optical detector 52. The light that is directed toward the object is reflected back and is also directed into the optical detector 52 by the beam splitter 56. By comparing the portion of the original beam and the returned beam, the optical detector can determine the distance to the object or other information regarding the object as is well known in radar systems.

Thus, there is provided by the present invention a diode laser array 10 in which a small bias can turn on all of the gain sections 16 so as to achieve the emission of light of high power from all of the DBR waveguides 18. This allows the array 10 to be quickly turned on and off so that it can be used for communication purposes. In addition, since the optical power out is greater than the bias needed to operate the array 10, the array 10 operates as an electro-optical amplifier. Although the array 10 has been shown as described as comprising a line of the gain sections 16, the array can also be formed of a plurality of the lines of gain sections 16 which are arranged in a two dimensional array of rows and columns

What is claimed is:

1. A diode laser array comprising:
a substrate of a semiconductor material having first and second opposed surfaces;
a plurality of spaced gain sections on the first substrate surface, each of said gain sections having a cavity therein for generating light and which can provide both a high differential gain and potentially large depth of loss modulation;
a distributed Bragg reflector passive waveguide at each end of each gain section and optically coupling said gain sections, said waveguides having a grating period to provide an operating wavelength which is on the short wavelength side of the gain peak of the gain sections;
means for applying a DC bias to each of said gain sections; and
means for applying a modulation pulse to only one of the gain sections.

2. An array in accordance with claim 1 in which the modulation pulse is a RF pulse.

3. An array in accordance with claim 1 in which each of the gain sections includes a semiconductor quantum well region.

4. An array in accordance with claim 3 in which each of the gain sections comprises a pair of clad layers of a semiconductor material of opposite conductivity types with the quantum well region being between the clad layers.

5. An array in accordance with claim 4 in which each of the clad layers is of a semiconductor material having an energy band-gap greater than that of the semiconductor material of the quantum well region.

6. An array in accordance with claim 5 in which each of the gain sections includes a confinement layer between each of the clad layers and the quantum well region, each of the confinement layers being of the same conductivity type as its adjacent clad layer and of a semiconductor material at least a portion of which has an energy band-gap which is between that of its adjacent clad layer and that, of the quantum well region.

7. An array in accordance with claim 6 in which each of the confinement layers is a graded layer in that it is of a material having an energy band-gap which decreases from that of its adjacent clad layer to a level above that of the quantum well region.

8. An array in accordance with claim 6 in which each gain section includes a conductive contact over and electrically connected to each of the outermost of the clad layers and a conductive contact on the second surface of the substrate.

9. An array in accordance with claim 8 in which each gain section includes a capping layer of a semiconductor material over the outermost of the clad layers, said capping layer being of the same conductivity type as the outermost clad layer, and the conductive contact is on the capping layer.

10. An array in accordance with claim 8 in which each of the waveguides includes a waveguide region between a pair of clad layers and a grating in the outermost of the clad layers.

11. An array in accordance with claim 10 in which the waveguide region of each waveguide is an extension of the quantum well region of the gain sections, and the clad layers are extensions of the clad layers of the gain sections.

12. An array in accordance with claim 11 in which each of the waveguides includes a confinement layer between each clad layer and the waveguide region with the confinement layers being extensions of the confinement layers of the gain sections.

13. An array in accordance with claim 12 in which the grating of each waveguide has a period such that the second grating order provides wavelength selective feedback into the gain sections to support laser oscillation, the first order couples light out of the waveguides normal to the first surface of the substrate, and the transmissivity is sufficient to optically couple adjacent gain sections.

14. A method of operating a diode laser array which includes on a surface of a substrate a plurality of spaced gain sections each having a cavity therein for generating light and which can provide both a high differential gain and potentially large depth of loss modulation, and a distributed Bragg reflection passive waveguide at each end of each gain section and optically coupling the gain section, the waveguides including a grating having a grating period to provide an operating wavelength which is on the short wavelength side of the gain peak of the gain sections, the method comprising the steps of:
applying a bias to all of the gain sections at a level below that of the threshold of the gain sections at which lasing oscillation occurs; and
applying a bias to only one of the gain sections to cause all of the gain sections to oscillate.

15. A method in accordance with claim 14 in which all of the gain sections are biased with a DC bias to a level just below the threshold of the gain sections, and a small modulation pulse is applied to the one gain section to cause all of the gain sections to oscillate.

16. A method in accordance with claim 15 in which the modulation pulse is an RF pulse.

17. In an optical communication system which includes a diode laser array for emitting a pulsed beam of light, a source of power for said array, and an optical detector for receiving the beam of light, said diode laser array comprising:
a substrate of a semiconductor material having first and second opposed surfaces;
a plurality of spaced gain sections on the first substrate surface, each of said gain sections having a cavity therein for generating light and which can provide both a high differential gain and potentially large depth of loss modulation;
a distributed Bragg reflector passive waveguide at each end of each gain section and optically coupling said gain sections, said waveguides having a grating period to provide an operating wavelength which is on the short wavelength side of the gain peak of the gain sections;
means for applying a DC bias to each of said gain sections; and
means for applying a modulation pulse to only one of the gain sections.

18. An optical communication system in accordance with claim 17 including an optical transmission telescope into which the array directs its beam for collimating the beam and directing it toward the detector, and an optical receiving telescope receiving the beam and directing it into the detector.

19. In an optical radar system which includes a diode laser array for generating a pulsed beam of light, means for directing the beam of light toward an object and an optical detector means for receiving the beam reflected from the object, the diode laser array comprising:
a substrate of a semiconductor material having first and second opposed surfaces;
a plurality of spaced gain sections on the first substrate surface, each of said gain sections having a cavity therein for generating light and which can provide both a high differential gain and potentially large depth of loss modulation;
a distributed Bragg reflector passive waveguide at each end of each gain section and optically coupling said gain sections, said waveguides having a grating period to provide an operating wavelength which is on the short wavelength side of the gain peak of the gain sections;
means for applying a DC bias to each of said gain sections; and
means for applying modulation pulses to only one of the gain sections.

20. An optical radar system in accordance with claim 19 including an optical transmission telescope into which the array emits its beam for collimating the beam and directing it toward the object, a beam splitter for directing a portion of the emitted beam to the detector and for directing the returned beam to the detector.

* * * * *